(12) United States Patent
Azuma

(10) Patent No.: US 7,852,032 B2
(45) Date of Patent: Dec. 14, 2010

(54) AD CONVERSION CONTROL CIRCUIT AND RELATED ARTS

(75) Inventor: Katsuji Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 429 days.

(21) Appl. No.: 12/026,786

(22) Filed: Feb. 6, 2008

(65) Prior Publication Data

US 2008/0252243 A1 Oct. 16, 2008

(30) Foreign Application Priority Data

Feb. 6, 2007 (JP) .............................. 2007-026436

(51) Int. Cl.
*G05B 11/28* (2006.01)

(52) U.S. Cl. .................. 318/599; 318/811; 318/569; 318/600

(58) Field of Classification Search ................ 318/569, 318/601, 432, 599, 811; 341/126, 141, 142, 341/155
See application file for complete search history.

(56) References Cited

U.S. PATENT DOCUMENTS

| | | | | |
|---|---|---|---|---|
| 3,648,278 A | * | 3/1972 | Miller | .......................... 341/169 |
| 5,349,351 A | * | 9/1994 | Obara et al. | ................. 341/141 |
| 5,736,948 A | | 4/1998 | Mitsuishi et al. | |
| 2003/0132086 A1 | * | 7/2003 | Thompson | ................... 198/762 |
| 2004/0117676 A1 | * | 6/2004 | Kobayashi et al. | .......... 713/300 |
| 2005/0219103 A1 | * | 10/2005 | Ogawa | ........................ 341/155 |
| 2006/0113938 A1 | * | 6/2006 | Arai | ........................... 318/432 |

FOREIGN PATENT DOCUMENTS

| | | |
|---|---|---|
| JP | 2003-284374 | 10/2003 |
| JP | 2004-357450 | 12/2004 |

OTHER PUBLICATIONS

The LSI Manual of MN103SA5K, Chapter 14, A/D Converter, pp. XIV-6-XIV-30 (Dec. 2004).

* cited by examiner

*Primary Examiner*—Rina I Duda
(74) *Attorney, Agent, or Firm*—McDermott Will & Emery LLP

(57) ABSTRACT

A selector selects an analog signal group to be used for PWM control out of a plurality of analog signals output by a PWM controlled load. An AD converter AD converts the analog signal group and generates a digital signal group that becomes control data for duty ratio setting in a duty ratio setting register to provide the generated digital signal group to a control unit for controlling a PWM circuit. A duty ratio comparison circuit compares duty ratios set by the plurality of duty ratio setting registers. An AD conversion channel selection circuit controls an analog signal group selecting operation by the selector based on a comparison result of the duty ratio comparison circuit.

14 Claims, 14 Drawing Sheets

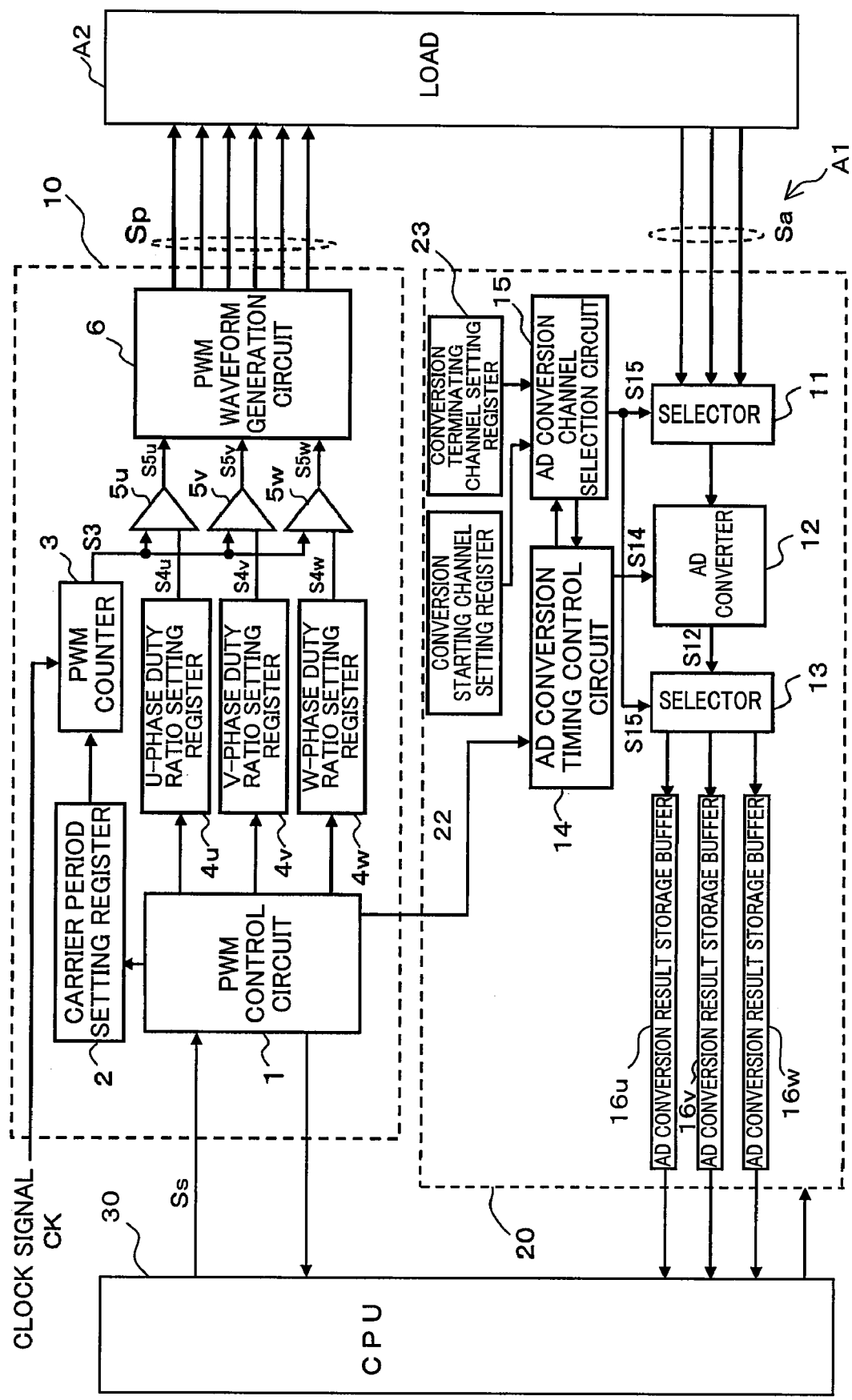

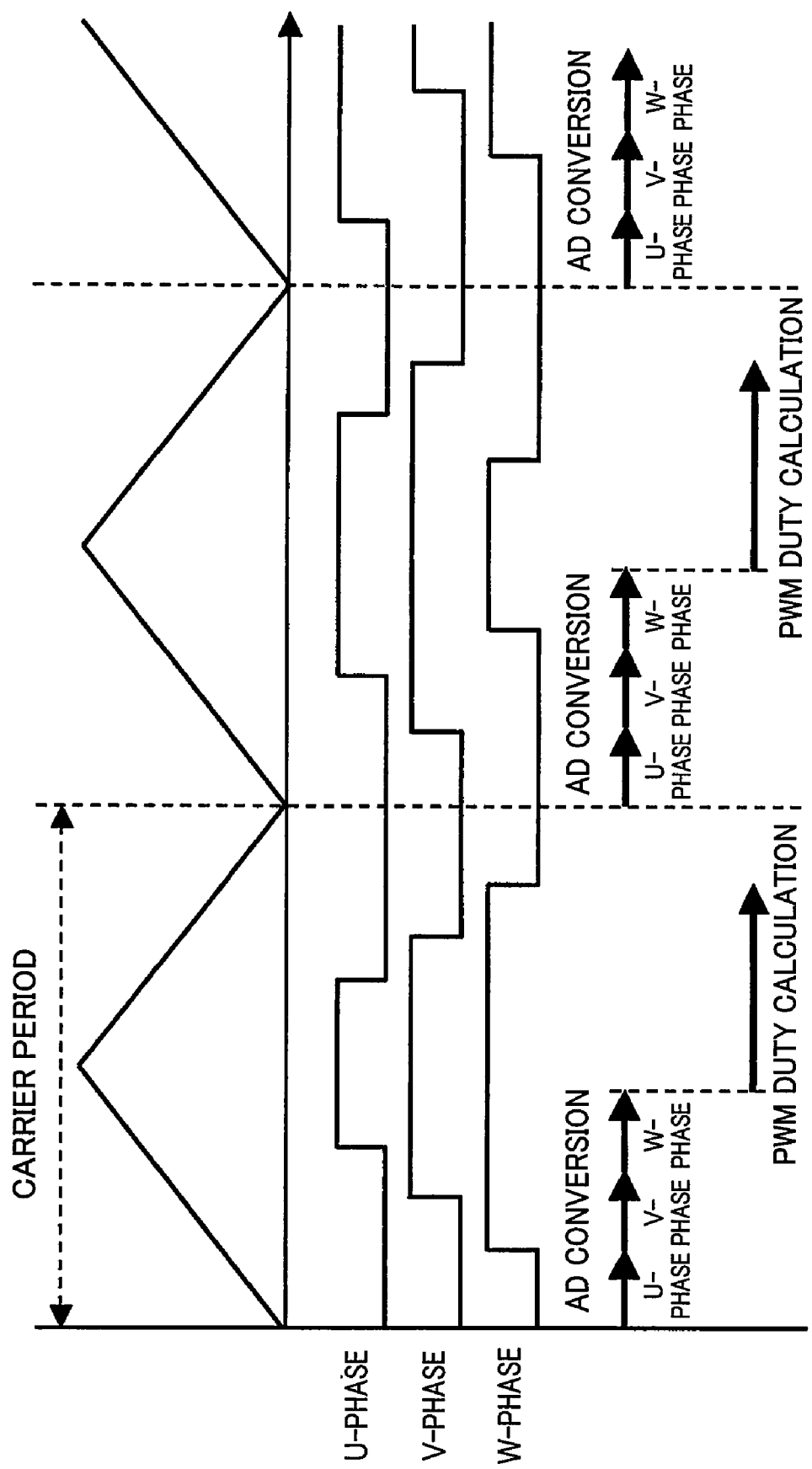

AD CONVERSION CONTROL CIRCUIT AND RELATED ARTS

BACKGROUND OF THE INVENTION

1. Field of the Invention

The present invention relates to an AD conversion control circuit for inverter controlling a motor.

2. Description of the Related Art

An inverter control device of a brushless motor configured by a microcontroller as one example of a PWM control device is disclosed in Japanese Laid-Open Patent Publication (Japanese Laid-Open Patent Publication No. 2004-357450).

However, in the above conventional inverter control device, a carrier period needs to be reduced and a complex calculation by a CPU is required when configured to perform inverter control of higher accuracy, and thus time necessary for AD conversion tends to become longer. Thus, it is desirable to reduce the time necessary for AD conversion. As a countermeasure therefor, Japanese Laid-Open Patent Publication (Japanese Laid-Open Patent Publication No. 2003-284374) discloses performing two-phase selection control by selecting two out of three phases and calculating the remaining phase from the two selected phases. However, the time necessary for AD conversion becomes longer with such a countermeasure.

SUMMARY OF THE INVENTION

Therefore, it is a main object of the present invention to render AD conversion effective only for a necessary channel, and to achieve control of high accuracy through reduction in time necessary for the AD conversion.

(1) An AD conversion control circuit according to the present invention relates to an AD conversion control circuit including a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit; an AD converter for AD converting the analog signal group and generating a digital signal group that becomes control data for duty ratio setting in the duty ratio setting register, and providing the generated digital signal group to a control unit for controlling the PWM circuit; a duty ratio comparison circuit for comparing the duty ratios set by the plurality of duty ratio setting registers; and an AD conversion channel selection circuit for controlling an analog signal group selecting operation by the selector based on a comparison result of the duty ratio comparison circuit. This is the two-phase selection control method.

According to such a configuration, the duty ratio comparison circuit in the AD conversion control circuit, connected to three duty ratio setting registers in an external PWM circuit, compares the values of the three duty ratio setting registers with each other to obtain a magnitude relation (large, middle, small) among three phases of U-phase, V-phase, and W-phase, and outputs the same to the AD conversion channel selection circuit. Specifically, the magnitude relation of the U-phase, the V-phase, and the W-phase includes six patterns of (large, middle, small), (large, small, middle), (small, large, middle), (middle, large, small), (middle, small, large), (small, middle, large), where the pattern of the magnitude relation changes for every carrier period. The AD conversion channel selection circuit inputs the pattern of the magnitude relation from the duty ratio comparison circuit and automatically selects two appropriate phases out of the three phases of U-phase, V-phase, and W-phase according to the pattern of the magnitude relation. As a general rule, the two selected phases are the first and the second in terms of magnitude. Thus, the AD conversion for the two necessary phases is performed by hardware means without setting the channel to be AD converted by software means for every carrier period. As a result, the AD conversion time necessary for every carrier period can be reduced, and motor control of higher accuracy can be achieved.

(2) An AD conversion control circuit according to the present invention relates to an AD conversion control circuit including a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit; an AD converter for AD converting the analog signal group and generating a digital signal group that becomes control data for duty ratio setting in the duty ratio setting register, and providing the generated digital signal group to a control unit for controlling the PWM circuit; an AD conversion result storage buffer for storing the digital signal group; a conversion result comparison circuit for comparing values of the digital signals stored in the AD conversion result storage buffers; and an AD conversion channel selection circuit for controlling an analog signal group selecting operation by the selector based on a comparison result of the conversion result comparison circuit. This is also a two-phase selection control method. In this case, the duty ratio comparison circuit of (1) is not arranged but instead, the conversion result comparison circuit is arranged, and is independent from the duty ratio setting register of the PWM circuit.

According to such a configuration, the conversion result comparison circuit outputs the result of comparing the values of the AD conversion result storage buffers of three channels (U-phase, V-phase, and W-phase) to the AD conversion channel selection circuit. The magnitude relation (large, middle, small) for three phases of U-phase, V-phase, and W-phase can be obtained by comparing the values of the three AD conversion result storage buffers. The AD conversion channel selection circuit inputs the pattern of the magnitude relation from the conversion result comparison circuit and automatically selects two appropriate phases out of the three phases of U-phase, V-phase, and W-phase according to the pattern of the relevant magnitude relation. As a general rule, the two selected phases are the first and the second in terms of magnitude. Thus, the AD conversion for the two necessary phases is performed by hardware means without setting the channel to be AD converted by software means for each carrier period. As a result, the AD conversion time necessary for every carrier period can be reduced, and motor control of higher accuracy can be achieved.

(3) The AD conversion control circuit of the above configuration includes a mode of further including an AD conversion timing control circuit for controlling a timing to start AD conversion of the AD converter; wherein a plurality of the AD converters are arranged; the selector distributes and provides the analog signal group to the plurality of AD converters; and the AD conversion timing control circuit performs control so that AD conversion processes of the plurality of AD converters to which the analog signal group has been distributed and provided are simultaneously started. This is a simultaneous conversion control method.

According to such a configuration, the AD conversion timing control circuit simultaneously AD converts the analog signals of two channels to be AD converted selected by the AD conversion channel selection circuit using the plurality of AD converters. As a result, the AD conversion time necessary for every carrier period can be reduced, and motor control of higher accuracy can be achieved.

(4) The AD conversion control circuit of the simultaneous conversion control method includes a plurality of PWM circuits operating at carrier periods different from each other are arranged as the PWM circuit, the PWM circuits each including a PWM counter for counting a clock signal; the AD conversion control circuit further includes a simultaneous conversion determining circuit for determining whether or not to perform simultaneous conversion control on the plurality of PWM circuits based on the value of the PWM counter, and an AD conversion timing control circuit for controlling a start timing to AD convert the analog signal in the AD converter; and the AD conversion timing control circuit determines whether or not to perform simultaneous conversion control on the plurality of PWM circuits based on a determination result of the simultaneous conversion determining circuit. According to such a configuration, the simultaneous conversion determining circuit determines whether or not to perform simultaneous conversion control based on the values of the plurality of PWM counters, and outputs the determination result to the AD conversion timing control circuit. If the values of the plurality of PWM counters are comparatively different from each other, the simultaneous conversion control is permitted in the AD conversion timing control circuit assuming that the timings of the AD conversion do not overlap. If the values of the plurality of PWM counters are comparatively close to each other, the simultaneous conversion control is prohibited in the AD conversion timing control circuit assuming that the timings of the AD conversion overlap. Therefore, even if the plurality of PWM circuits operate at different carrier periods, the AD conversion necessary for every carrier period can be performed in a minimum time irrespective of the timing of each AD conversion.

(5) The AD conversion control circuit of (4) includes a mode of further including a conversion timing storage register for storing information on a timing at which the analog signal group is AD converted by the AD converter for every analog signal. According to such a configuration, the conversion timing storage register stores information indicating at which timing the AD conversion is performed. When calculating the duty ratio of the PWM signal to be output from the PWM circuit in the next carrier period based on the values of the AD conversion result storage buffers, the timing of AD conversion stored in the conversion timing storage register is read out and used to calculate the duty ratio for the calculation performed when the simultaneous conversion control is prohibited, so that a more accurate calculation is performed, and motor control of higher accuracy can be performed.

In any one of the AD conversion control circuits described above, PWM circuit preferably includes a carrier period setting register for storing a carrier period; a PWM counter for counting a clock signal; and a U-phase duty ratio setting register, a V-phase duty ratio setting register, and a W-phase duty ratio setting register for setting a duty ratio of an PWM output for a U-phase, a V-phase, and a W-phase, respectively.

An integrated circuit according to the present invention includes the PWM circuit, the AD conversion control circuit of the present invention, and the control unit.

A motor control device according to the present invention includes a motor serving as the load and the integrated circuit of the present invention.

According to the present invention, higher accuracy in the generation of the PWM signal and the carrier frequency is achieved by reducing the time of AD conversion necessary for inverter control, and the load such as a motor can be controlled at low noise and low vibration.

The inverter control by the AD conversion control circuit of the present invention is useful in alleviating noise and saving energy in home electric appliances such as an air conditioner, washing machine, and refrigerator.

BRIEF DESCRIPTION OF THE DRAWINGS

Other objects of the invention will become apparent by understanding the embodiments described below, and will be defined in the attached Claims. A great number of benefits not mentioned in the specification should be apparent to those skilled in the art by implementing the invention.

FIG. 13 is a block diagram showing a configuration of a microcontroller incorporating an AD conversion control circuit; and FIG. 14 is a timing chart showing the operation of the microcontroller incorporating the AD conversion control circuit.

DETAILED DESCRIPTION OF THE INVENTION

Figure 1:
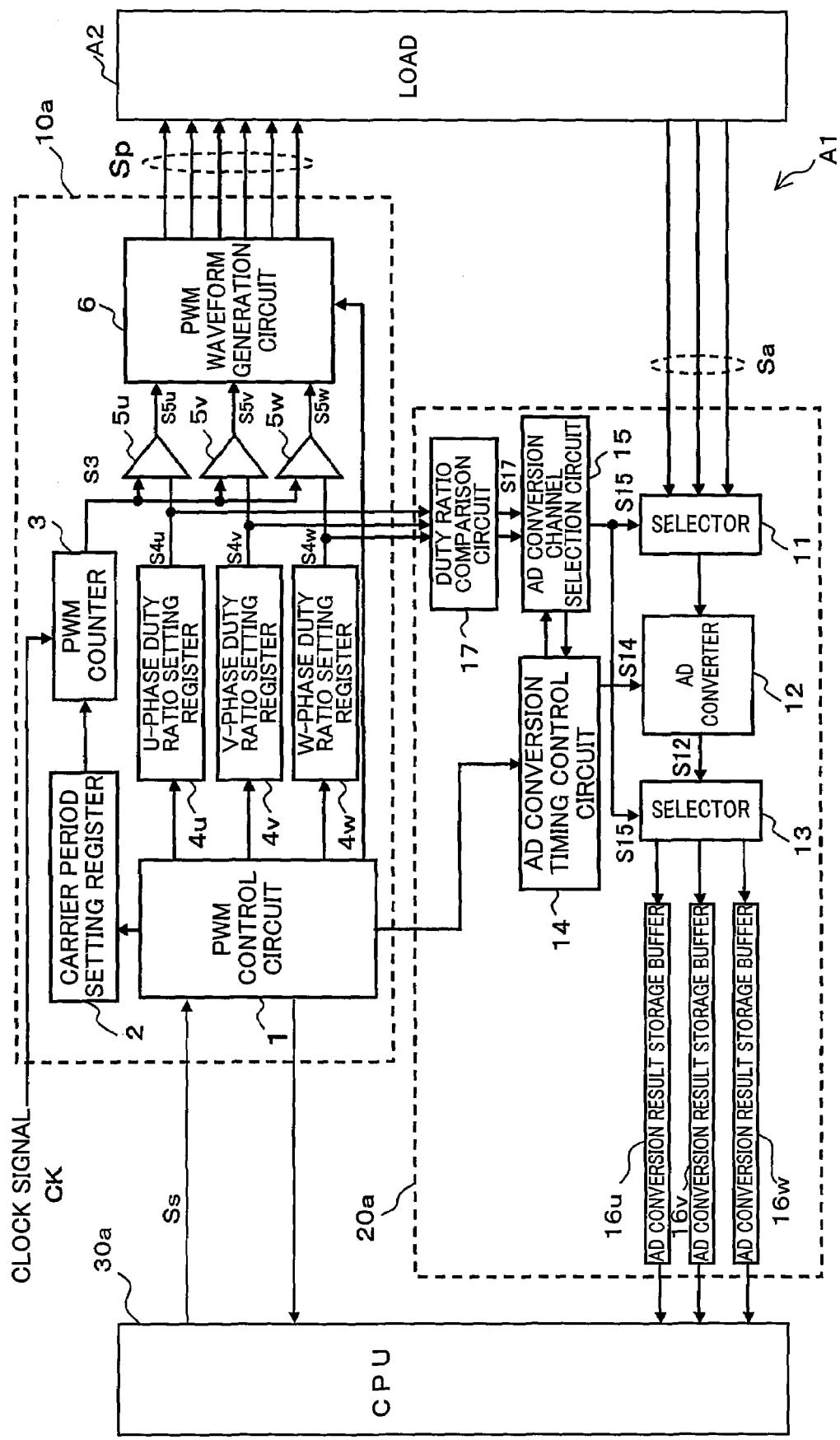
FIG. 1 is a block diagram showing a configuration of a microcontroller incorporating an AD conversion control circuit of a first embodiment of the present invention.

Before describing embodiments of the present invention, the PWM control device set forth as a premise in the present invention will be described with reference to FIG. 13. A PWM circuit 10 includes a PWM control circuit 1 for performing overall control of an internal circuit; a carrier period setting register 2 for setting the carrier period of the PWM; a PWM counter 3 for up/down counting a clock signal CK; a U-phase duty ratio setting register 4u, a V-phase duty ratio setting register 4v, and a W-phase duty ratio setting register 4w for setting the duty ratio of a PWM signal Sp of each of U, V, and W phases; a comparator 5u for comparing a value S3 of the PWM counter 3 and a value S4u of the U-phase duty ratio setting register 4u; a comparator 5v for comparing the value S3 of the PWM counter 3 and a value S4v of the V-phase duty ratio setting register 4v; a comparator 5w for comparing the value S3 of the PWM counter 3 and a value S4w of the W-phase duty ratio setting register 4w; and a PWM waveform generation circuit 6 for generating the PWM signal Sp from the comparison results of the comparators 5u, 5v, and 5w.

An AD conversion control circuit 20 includes an AD converter 12; a pre-stage selector 11 for selecting a signal to be input to the AD converter 12 from a plurality of analog signals Sa; a post-stage selector 13 for selecting an AD conversion result storage buffer 16u, 16v, 16w for storing an AD converted digital signal S12; an AD conversion timing control circuit 14 for sending an AD conversion start signal S14 to the AD converter 12; an AD conversion channel selection circuit 15 for outputting a conversion channel selection signal S15 to the pre-stage selector 11 and the post-stage selector 13; a conversion starting channel setting register 22 for setting the first channel to undergo AD conversion; and a conversion terminating channel setting register 23 for setting the last channel to undergo AD conversion.

The operation of such a configuration will now be described. The PWM counter 3 up/down counts the clock signal CK between "0" and the value of the carrier period setting register 2, and outputs the count value S3 to the comparators 5u, 5v, 5w.

The comparator 5u compares the value S3 of the PWM counter 3 and the value S4u of the U-phase duty ratio setting register 4u, and outputs a comparison result signal S5u of "L" level when the PWM counter value S3 is lower than or equal to the value S4u of the U-phase duty ratio setting register 4u in the comparison result, and outputs the comparison result signal S5u of "H" level when the PWM counter value S3 exceeds the value S4u of the U-phase duty ratio setting register 4u.

The comparator 5v compares the value S3 of the PWM counter 3 and the value S4v of the V-phase duty ratio setting register 4v, and outputs a comparison result signal S5v of "L" level when the PWM counter value S3 is lower than or equal to the value S4v of the V-phase duty ratio setting register 4v in the comparison result, and outputs the comparison result signal S5v of "H" level when the PWM counter value S3 exceeds the value S4v of the V-phase duty ratio setting register 4v.

The comparator 5w compares the value S3 of the PWM counter 3 and the value S4w of the W-phase duty ratio setting register 4w, and outputs a comparison result signal S5w of "L" level when the PWM counter value S3 is lower than or equal to the value S4w of the W-phase duty ratio setting register 4w in the comparison result, and outputs the comparison result signal S5w of "H" level when the PWM counter value S3 exceeds the value S4w of the W-phase duty ratio setting register 4w.

The comparison result signals S5u, S5v, S5w are input to the PWM waveform generation circuit 6, which generates complementary PWM signals Sp (U+, U−, V+, V−, W+, W−) for three phases, and provides the PWM signals Sp to six switch transistors of a motor drive circuit 40 in a motor control unit A2.

The AD conversion control circuit 20 sets the first channel to undergo the AD conversion by means of the conversion starting channel setting register 22 and the last channel to undergo the AD conversion by means of the conversion terminating channel setting register 23. The AD conversion channel selection circuit 15 outputs the selection signal S15 for sequentially selecting the analog signal Sa for three phases to the pre-stage selector 11 and the post-stage selector 13. The AD converter 12 AD converts the analog signal Sa of the selected (arbitrary) channel input from the pre-stage selector 11 based on the AD start signal S14 from the AD conversion timing control circuit 14, and stores the conversion result to one of the AD conversion result storage buffers 16u, 16v, 16w. The AD conversion is sequentially performed for the three phases.

FIG. 14 is a timing chart of inverter control of a brushless motor 50 having the above configuration. The AD conversion for three phases of U-phase, V-phase, and W-phase is performed for every carrier period, and the duty ratio of the PWM signal Sp to be output from the PWM circuit 10 in the next carrier period is calculated based on the AD conversion result. In the case of FIG. 14, the first channel to undergo the AD conversion set in the conversion starting channel setting register 22 is the U-phase, and the last channel set in the conversion terminating channel setting register 23 is the W-phase. Therefore, the pre-stage selector 11 and the post-stage selector 13 each select the analog signal Sa in the order of U-phase, V-phase, and W-phase. The AD conversion is performed for three phases regardless of the value set in the register.

However, in the two-phase selection control, the channel to start the conversion and the channel to terminate the conversion can only be set in the current AD conversion control circuit 20, and two optimum phases conformable to an actual state cannot be selected by hardware means. As a result, all three phases has to be AD converted. Therefore, the time necessary for the AD conversion becomes longer than necessary and high-accuracy motor control becomes difficult. Such disadvantages are resolved by the present invention.

Figure 12:
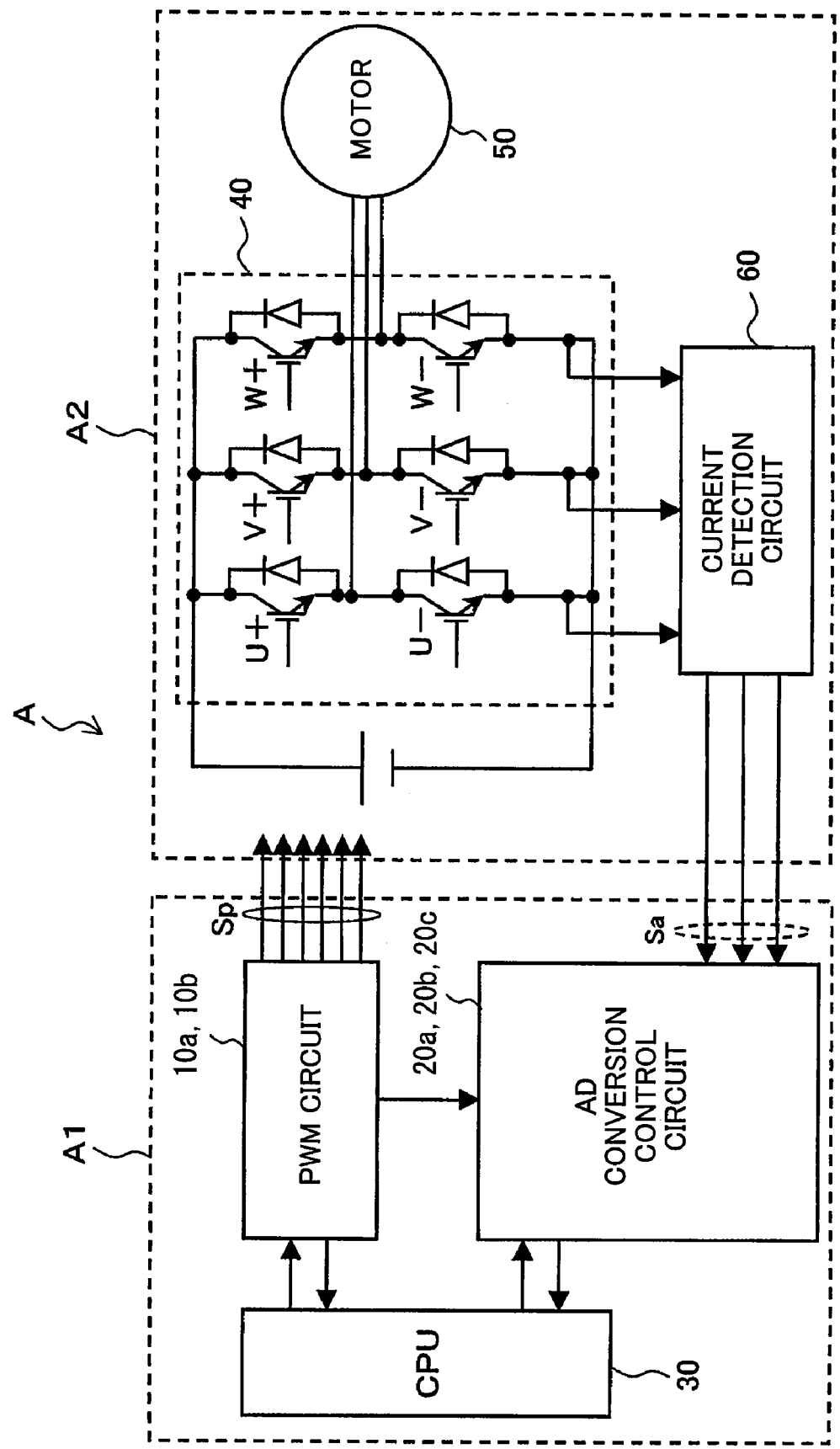
FIG. 12 is a block diagram of a motor control system configured by a microcontroller.

The embodiment of the present invention will now be described in detail with reference to the drawings. Before describing each embodiment, the overall configuration of the PWM control device common throughout the embodiments will be described with reference to FIG. 12. The overall configuration of the brushless motor control circuit A serving as one example will be described below.

A brushless motor control circuit A includes a microcontroller A1 serving as one example of a PWM control device including an integrated circuit, and a motor control circuit A2 serving as one example of a load. The microcontroller A1 includes a PWM circuit 10a, 10b, an AD conversion control circuit 20a, 20b, 20c, and a CPU 30. The motor control circuit A2 includes a motor drive circuit 40 including an inverter, a brushless motor 50, and a current detection circuit 60.

The PWM circuit 10a, 10b generates three sets of complementary PWM signal Sp, and provides the PWM signal Sp to the motor drive circuit 40. The motor drive circuit 40 includes six switch elements, which drive control the brushless motor 50 by being ON/OFF controlled by the PWM signal Sp. In this case, current flowing to each of the three phases is detected in the current detection circuit 60 for every carrier period, and the detection result is fed back to the AD conversion control circuit 20a to 20c as the analog signal Sa. The AD conversion control circuit 20a to 20c incorporates the AD converter. The AD converter AD converts the analog signal Sa and provides the AD converted result (current value for three phases) to the CPU 30. The CPU 30 calculates a duty ratio of the PWM signal Sp to be output from the PWM circuit 10a, 10b in the next carrier period based on the AD conversion result, and provides the duty ratio to the PWM circuit 10. The PWM circuit 10 generates the PWM signal Sp according to the provided duty ratio, and provides the PWM signal Sp to the motor drive circuit 40.

Each embodiment of the present invention will now be described.

First Embodiment

FIG. 1 is a block diagram showing a configuration of the microcontroller A1 incorporating an AD conversion control circuit 20a in the first embodiment of the present invention. The microcontroller A1 includes the PWM circuit 10a, the AD conversion control circuit 20a, and a CPU (control unit) 30a. The PWM circuit 10a includes a PWM control circuit 1 for performing overall control; a carrier period setting register 2 for setting the carrier period of the PWM; a PWM counter 3 for up/down counting a clock signal CK; a U-phase duty ratio setting register 4u, a V-phase duty ratio setting register 4v, and a W-phase duty ratio setting register 4w for setting the duty ratio of the PWM signal of each of U, V, and W phases, respectively; a comparator 5u for comparing a count value S3 of the PWM counter 3 and a set value S4u of the U-phase duty ratio setting register 4u; a comparator 5v for comparing the count value S3 of the PWM counter 3 and a set value S4v of the V-phase duty ratio setting register 4v; a comparator 5w for comparing the count value S3 of the PWM counter 3 and a set value S4w of the W-phase duty ratio setting register 4w; and a PWM waveform generation circuit 6 for generating the PWM signal Sp based on the comparison results of the comparators 5u, 5v, and 5w.

The AD conversion control circuit 20a includes an AD converter 12; a pre-stage selector 11 for selecting a signal to be input to the AD converter 12 from a plurality of analog signals Sa; AD conversion result storage buffers 16u, 16v, 16w for temporarily storing the AD converted digital signal S12 and providing the stored digital signal S12 to the CPU 30a; a post-stage selector 13 for selecting the storage destination of the digital signal S12 from the AD conversion result storage buffers 16u, 16v, 16w; an AD conversion timing control circuit 14 for sending an AD conversion start signal S14 to the AD converter 12; an AD conversion channel selection circuit 15 for outputting a conversion channel selection signal S15 to the pre-stage selector 11 and the post-stage selector 13; and a duty ratio comparison circuit 17 for comparing the values output from the PWM circuit 10a (duty ratio set value S4u of the U-phase dusty ratio setting register 4u, duty ratio set value S4v of the V-phase duty ratio setting register 4v, duty ratio set value S4w of the W-phase dusty ratio setting register 4w).

The CPU 30a calculates the duty ratio of the PWM signal Sp to be output from the PWM circuit 10a in the next carrier period based on the digital signal S12 provided from the AD conversion result storage buffers 16u, 16v, 16w, and then provides a control signal Ss indicating the calculated duty ratio to the PWM control circuit 1 of the PWM circuit 10.

Figure 2:
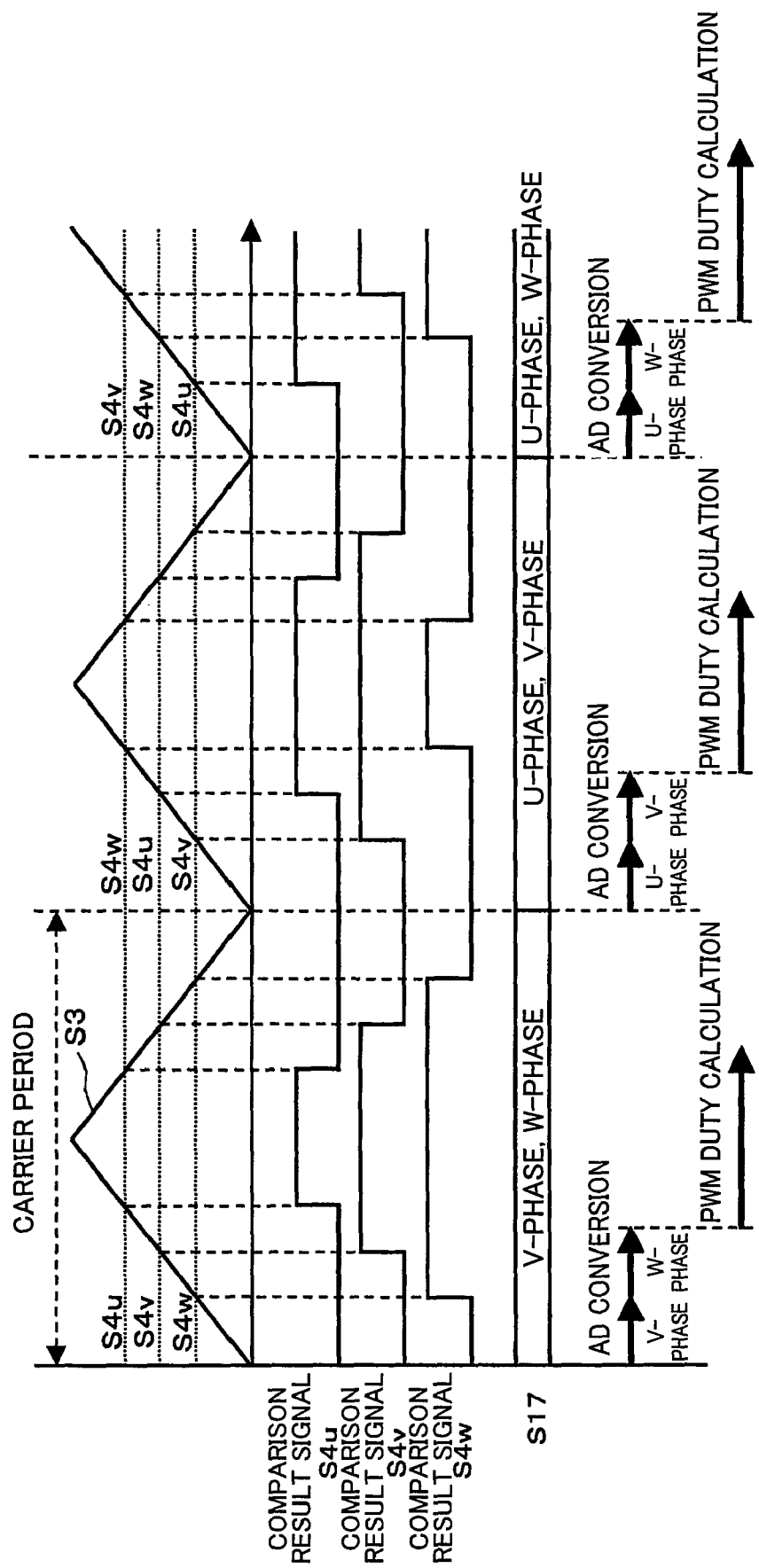
FIG. 2 is a timing chart showing the operation of the microcontroller incorporating the AD conversion control circuit of the first embodiment of the present invention.

The operation of the microcontroller A1 incorporating the AD conversion control circuit 20a of the present embodiment configured as above will now be described according to the timing chart of FIG. 2. The PWM counter 3 up/down counts the clock signal CK between "0" and the value of the carrier period setting register 2, and outputs the count value S3 to the comparators 5u, 5v, 5w.

The comparator 5u compares the value S3 of the PWM counter 3 and the value S4u of the U-phase duty ratio setting register 4u, and outputs a comparison result signal S5u of "L" level when the PWM counter value S3 is lower than or equal to the value S4u of the U-phase duty ratio setting register 4u, and outputs the comparison result signal S5u of "H" level when the PWM counter value S3 exceeds the value S4u of the U-phase duty ratio setting register 4u.

The comparator 5v compares the value S3 of the PWM counter 3 and the value S4v of the V-phase duty ratio setting register 4v, and outputs a comparison result signal S5v of "L" level when the PWM counter value S3 is lower than or equal to the value S4v of the V-phase duty ratio setting register 4v, and outputs the comparison result signal S5v of "H" level when the PWM counter value S3 exceeds the value S4v of the V-phase duty ratio setting register 4v.

The comparator 5w compares the value S3 of the PWM counter 3 and the value S4w of the W-phase duty ratio setting register 4w, and outputs a comparison result signal S5w of "L" level when the PWM counter value S3 is lower than or equal to the value S4w of the W-phase duty ratio setting register 4w, and outputs the comparison result signal S5w of "H" level when the PWM counter value S3 exceeds the value S4w of the W-phase duty ratio setting register 4w.

The comparison result signals S5u, S5v, S5w are input to the PWM waveform generation circuit 6. The PWM waveform generation circuit 6 generates complementary PWM signals (U+, U−, V+, V−, W+, W−) for three phases based on the comparison result signals S5u, S5v, S5w, and provides the same to the six switch transistors of the motor drive circuit 40 in the motor control circuit A2.

The values S4u, S4v, S4w of the U-phase duty ratio setting register 4u, the V-phase duty ratio setting register 4v, and the W-phase duty ratio setting register 4w in the PWM circuit 10a may change for every carrier period, and the values S4u, S4v, S4w are provided to the duty ratio comparison circuit 17 in the AD conversion control circuit 20a.

The duty ratio comparison circuit 17 compares the provided three values S4u, S4v, S4w, selects the value having the largest duty ratio and the value having the second largest duty ratio, and outputs a selection signal S17 indicating the selection result to the AD conversion channel selection circuit 15. The AD conversion channel selection circuit 15 determines the channel which will perform the AD conversion based on the selection signal S17, and outputs the selection signal S15 indicating the determined channel to the pre-stage selector 11 and the post-stage selector 13. Specifically, the AD conversion channel selection circuit 15 determines the channel phase indicating the value having the largest duty ratio and the channel phase indicating the value having the second largest duty ratio as selected channels.

The pre-stage selector 11 selects the analog signals of the two channels from the plurality of analog signals Sa provided from the motor control circuit (load) A2 based on the conversion channel selection signal S15 provided from the AD conversion channel selection circuit 15, and outputs the selected analog signals to the AD converter 12. The AD converter 12 sequentially AD converts the analog signals of the two channels selected by the pre-stage selector 11 on a channel-by-channel basis. In this case, the AD converter 12 AD converts the analog signals in synchronization with the AD start signal S14 provided from the AD conversion timing control circuit 14, and outputs the AD converted analog signal to the post-stage selector 13. The post-stage selector 13 selects the storage destination of the digital signal S12 from the AD conversion result storage buffers 16u, 16v, 16w based on the conversion channel selection signal S15 provided from the AD conversion channel selection circuit 15, and outputs the digital signal S12 provided from the AD converter 12 to the selected AD conversion result storage buffers 16u, 16v, 16w.

According to such a configuration, the two phases necessary in setting the duty ratio of the next carrier period are automatically selected, and AD converted. Thus, the AD conversion time necessary for every carrier period can be reduced, and motor control of higher accuracy can be performed.

Second Embodiment

Figure 3:
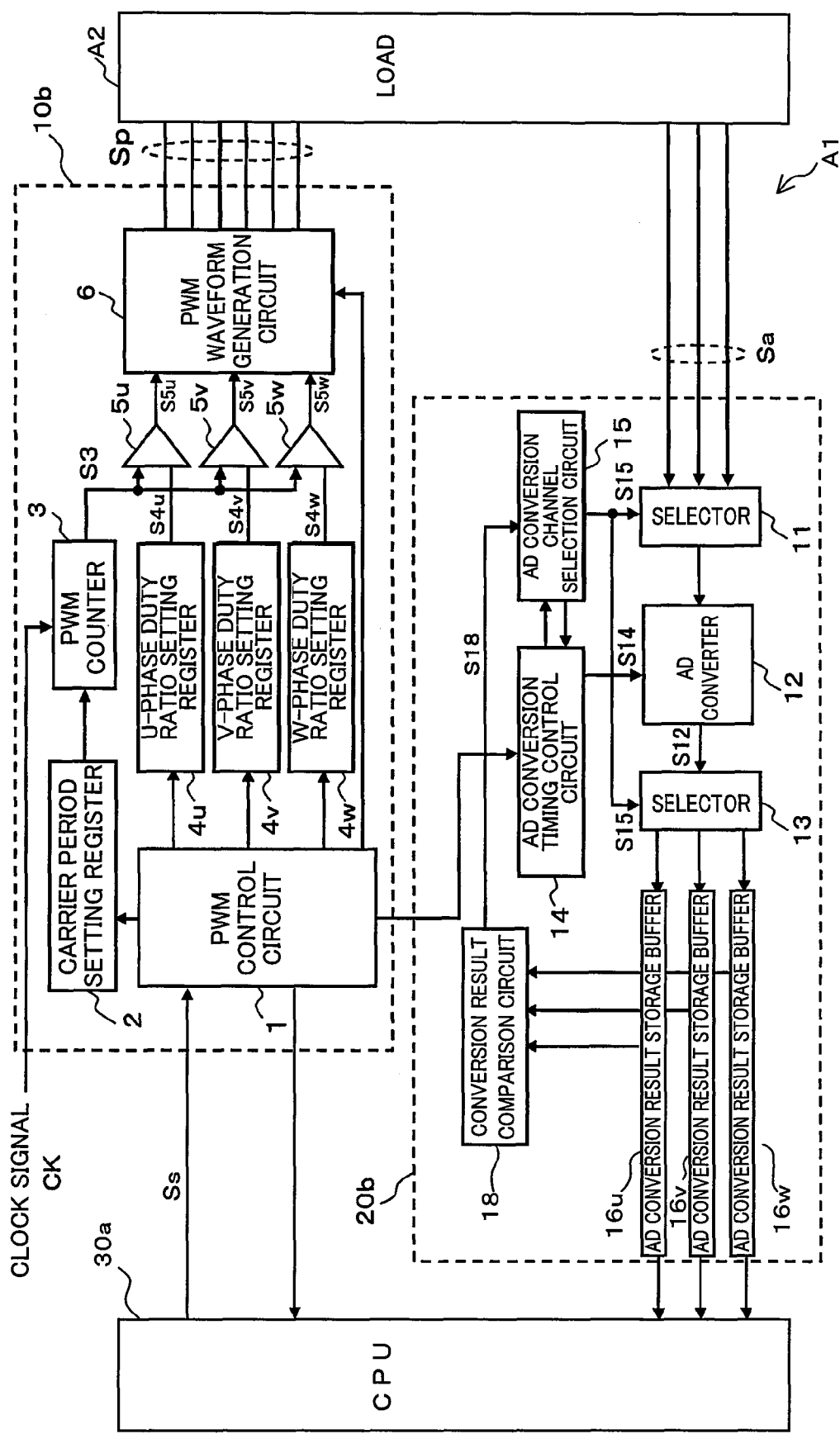
FIG. 3 is a block diagram showing a configuration of a microcontroller incorporating an AD conversion control circuit of a second embodiment of the present invention.

FIG. 3 is a block diagram showing a configuration of a microcontroller incorporating an AD conversion control circuit in a second embodiment of the present invention. In FIG. 3, the same reference numerals as in FIG. 1 of the first embodiment denote the same components and specific description thereof will not be repeated.

The AD conversion control circuit 20b includes the pre-stage selector 11, the AD converter 12, the post-stage selector 13, the AD conversion timing control circuit 14, the AD conversion channel selection circuit 15, and the AD conversion result storage buffers 16u, 16v, 16w, as is the case with the first embodiment, and further includes a conversion result comparison circuit 18 for comparing each of stored values with the other in the AD conversion result storage buffers 16u, 16v, 16w. The duty ratio comparison circuit 17 in the first embodiment is not arranged.

Figure 4:
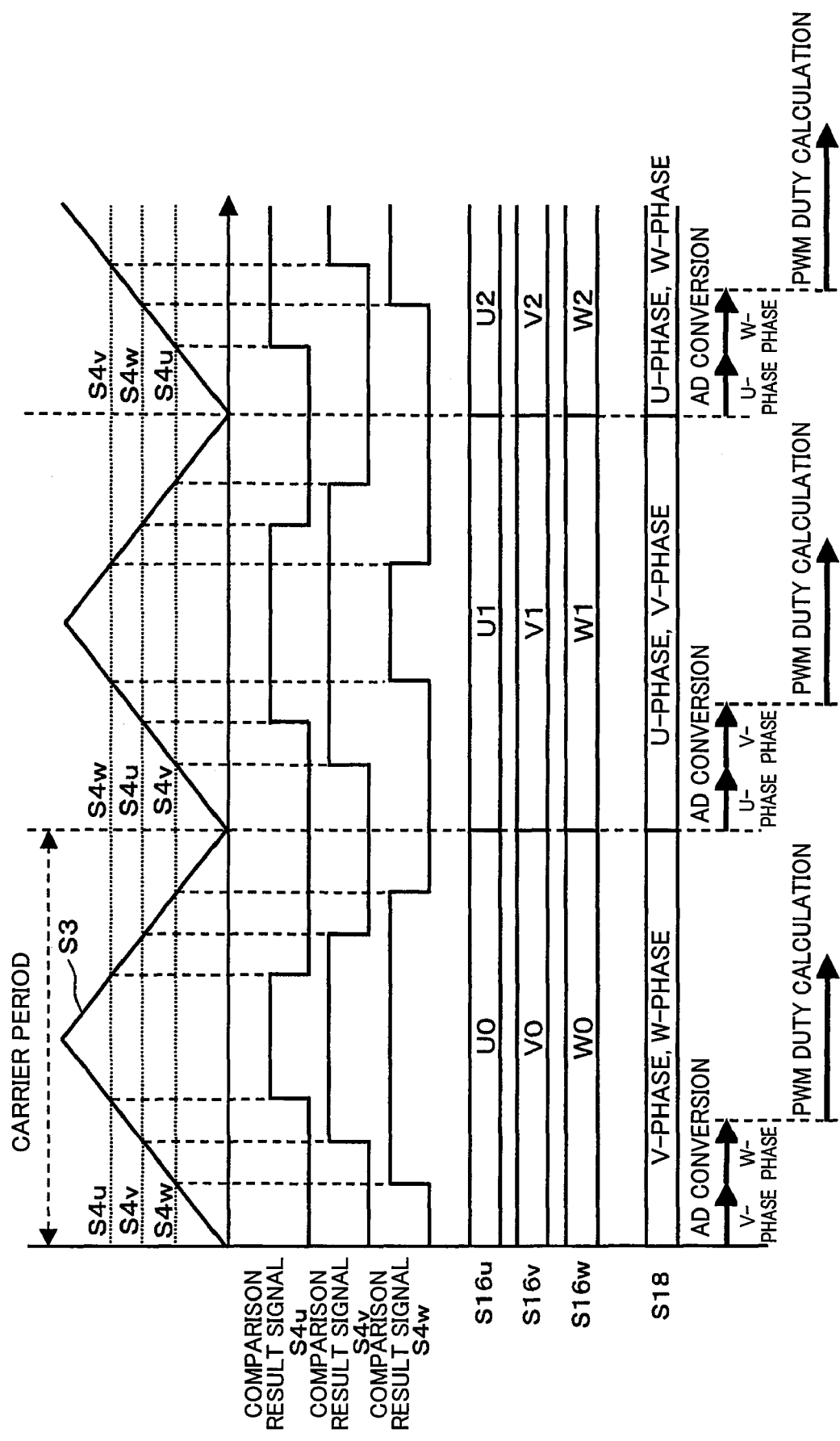
FIG. 4 is a timing chart showing the operation of the microcontroller incorporating the AD conversion control circuit of the second embodiment of the present invention.

The operation of the microcontroller A2 incorporating the AD conversion control circuit 20b of the present embodiment configured as above will now be described according to the timing chart of FIG. 4. The conversion result comparison circuit 18 compares the values of the AD conversion result storage buffers 16u, 16v, 16w, selects two phases to be AD converted in the next carrier period, and outputs a selection signal S18 to the AD conversion channel selection circuit 15. That is, the conversion result comparison circuit 18 compares three values stored in the AD conversion result storage buffers 16u, 16v, 16w, selects the largest converted value and the second largest converted value, and outputs the selection signal S18 indicating the selection result to the AD conversion channel selection circuit 15. Specifically, the AD conversion channel selection circuit 15 determines the channel phase having the largest converted value and the channel phase having the second largest converted value as selected channels.

The AD conversion channel selection circuit 15 determines the channel which will perform the AD conversion based on the selection signal S18, and outputs the selection signal S15 to the pre-stage selector 11 and the post-stage selector 13. The AD converter 12 sequentially AD converts the analog signals of the two channels selected by the pre-stage selector 11 out of the plurality of analog signals Sa on a channel-by-channel basis based on the AD start signal S14 provided from the AD conversion timing control circuit 14.

According to such a configuration, the two phases necessary in setting the duty ratio of the next carrier period are automatically selected, and AD converted. Thus, the AD conversion time necessary for every carrier period can be reduced, and motor control of higher accuracy can be performed.

Third Embodiment

Figure 5:
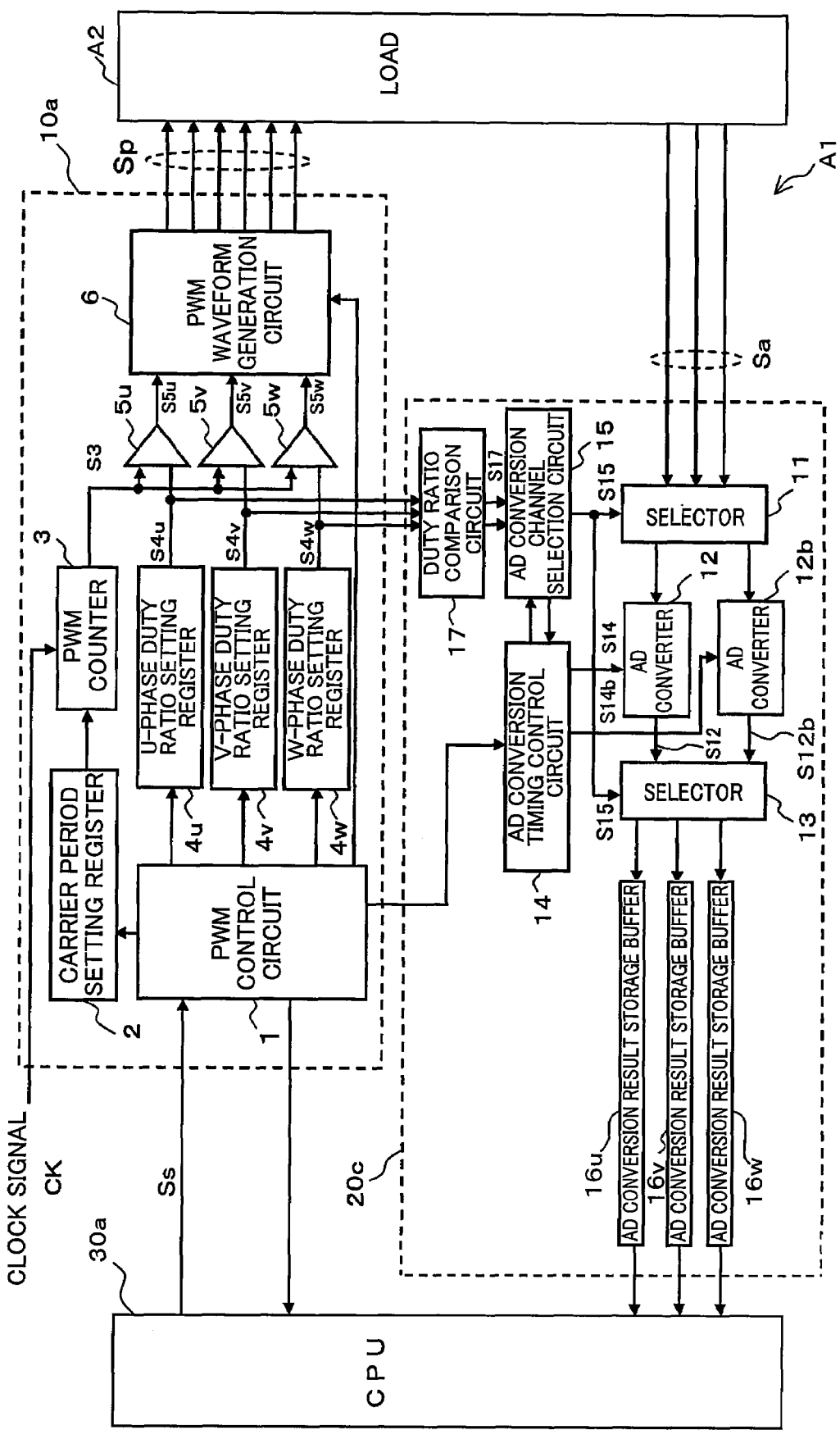
FIG. 5 is a block diagram showing a configuration of a microcontroller incorporating an AD conversion control circuit of a third embodiment of the present invention.

FIG. 5 is a block diagram showing a configuration of a microcontroller incorporating an AD conversion control circuit in a third embodiment of the present invention. In FIG. 5, the same reference numerals as in FIG. 1 of the first embodiment denote the same components and specific description thereof will not be repeated. Further to the components shown in FIG. 1, an AD converter 12b is arranged in addition to the AD converter 12. The pre-stage selector 11 is configured to select the signal Sa to be input to the AD converter 12 and the analog signal Sa to be input to the AD converter 12b from the plurality of analog signals Sa, and the post-stage selector 13 is configured to select the storage destination of the digital signal S12 converted by the AD converter 12 and the digital signal S12b converted by the AD converter 12b from the AD conversion result storage buffers 16u, 16v, 16w. The AD conversion timing control circuit 14 is configured to simultaneously control the AD conversion start timings of the two AD converters 12, 12b.

Figure 6:
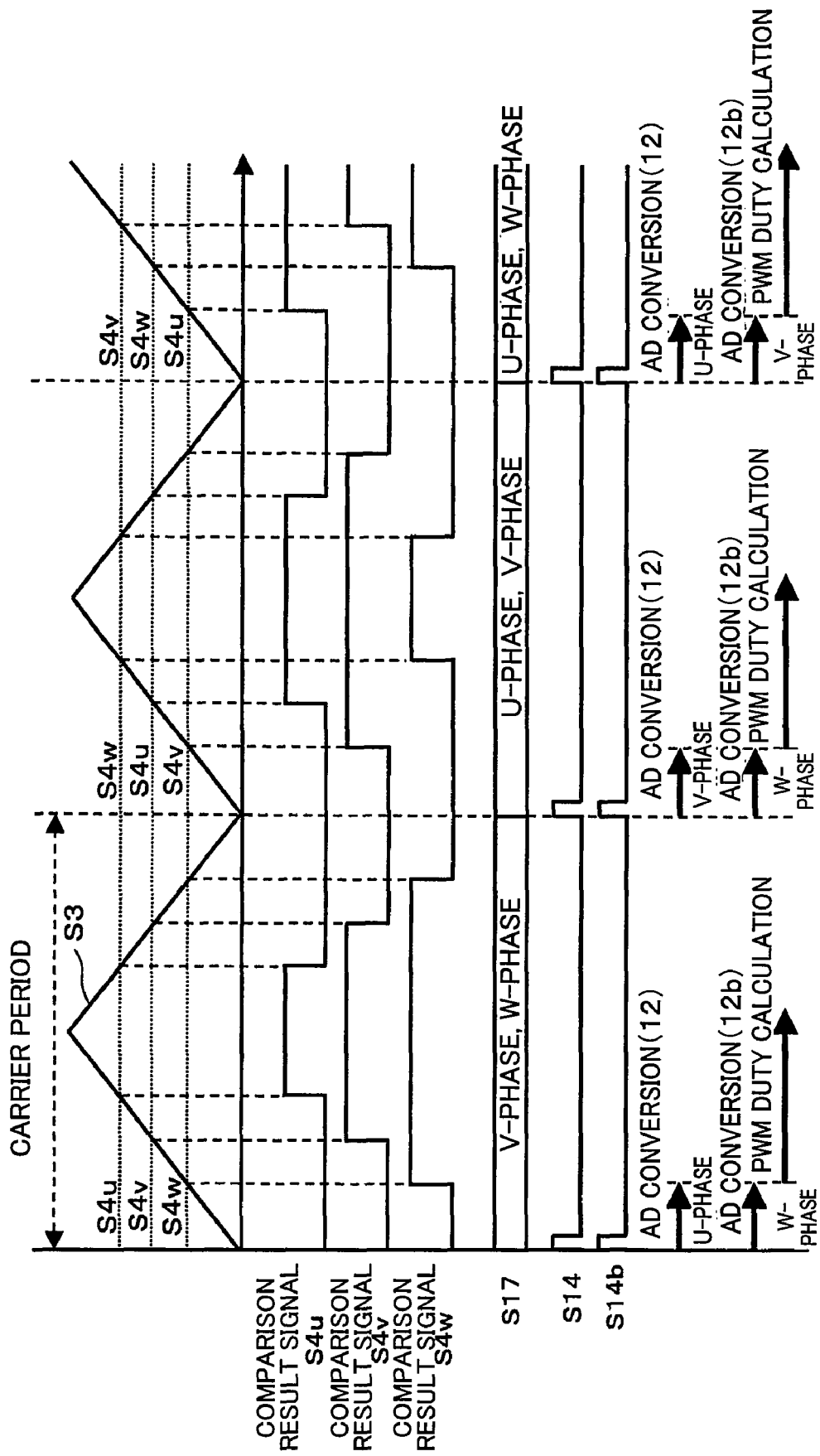
FIG. 6 is a timing chart showing the operation of the microcontroller incorporating the AD conversion control circuit of the third embodiment of the present invention.

The operation of the microcontroller incorporating the AD conversion control circuit 20c of the present embodiment configured as above will now be described according to the flowchart of FIG. 6. The pre-stage selector 11 provides the analog signal Sa of one channel to the AD converter 12 and provides the analog signal Sa of the other channel to the AD converter 12b based on the two channels selected in the AD conversion channel selection circuit 15. The AD conversion timing control circuit 14 simultaneously outputs the AD conversion start signals S14, S14b to the AD converter 12 and the AD converter 12b.

According to such a configuration, AD conversion for two phases necessary in setting the duty ratio of the next carrier period can be simultaneously executed in two AD converters. Thus, the AD conversion time necessary for every carrier period can be further reduced, and motor control of higher accuracy can be performed.

Fourth Embodiment

Figure 7:
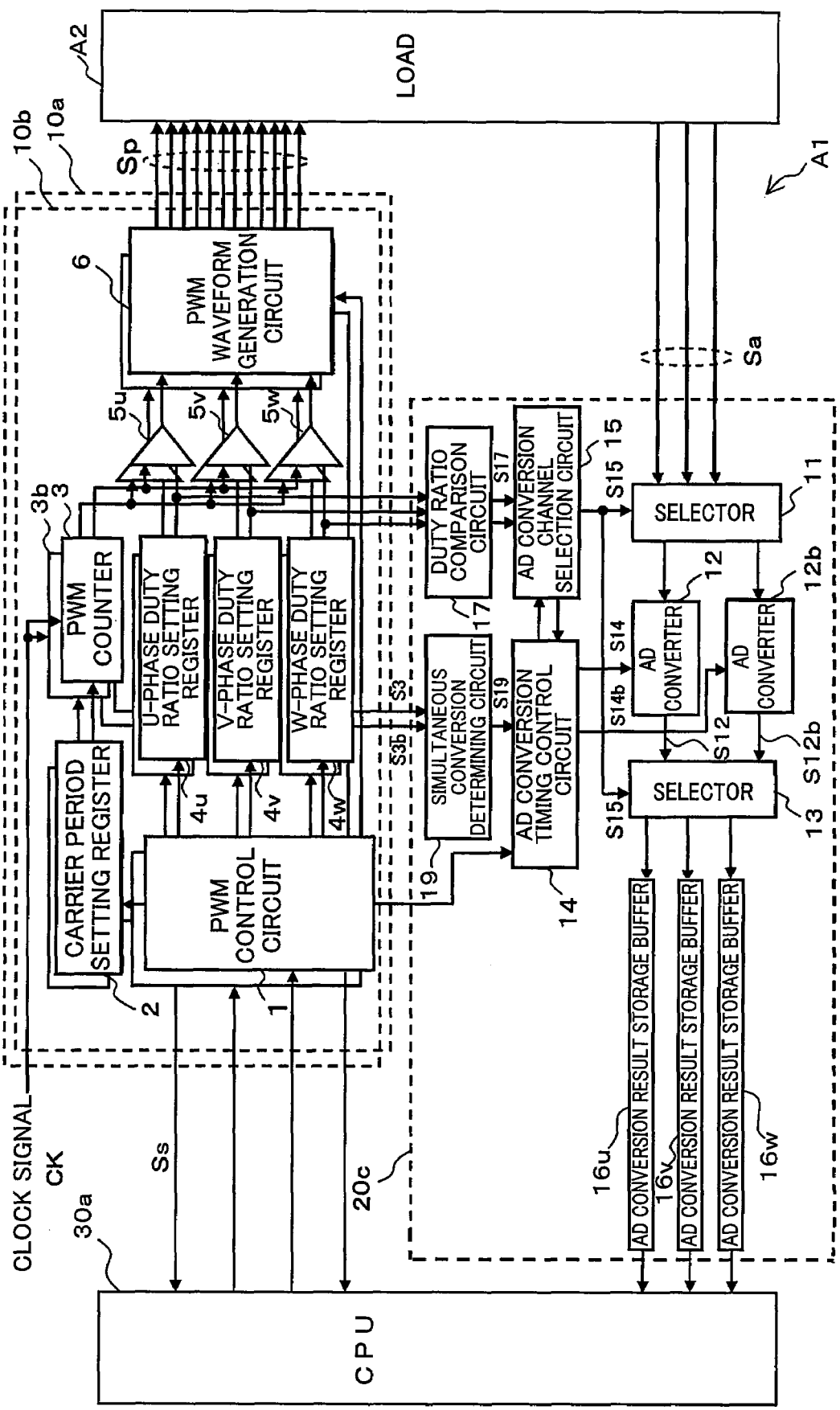
FIG. 7 is a block diagram showing a configuration of a microcontroller incorporating an AD conversion control circuit of a fourth embodiment of the present invention.

FIG. 7 is a block diagram showing a configuration of a microcontroller incorporating an AD conversion control circuit in a fourth embodiment of the present invention. In FIG. 7, the same reference numerals as in FIG. 5 of the third embodiment denote the same components and specific description thereof will not be repeated. In addition to the components shown in FIG. 5, a PWM circuit 10b having the same configuration as that of the PWM circuit 10a is further arranged. The PWM circuits 10a, 10b operate at carrier periods different from each other. Furthermore, a simultaneous conversion determining circuit 19 for determining whether or not to simultaneously convert the analog signal Sa of one channel and the analog signal Sa of the other channel based on the count value S3 of the PWM counter 3 of the PWM circuit 10a and the count value S3b of the PWM counter 3b of the PWM circuit 10b is arranged.

Figure 8:
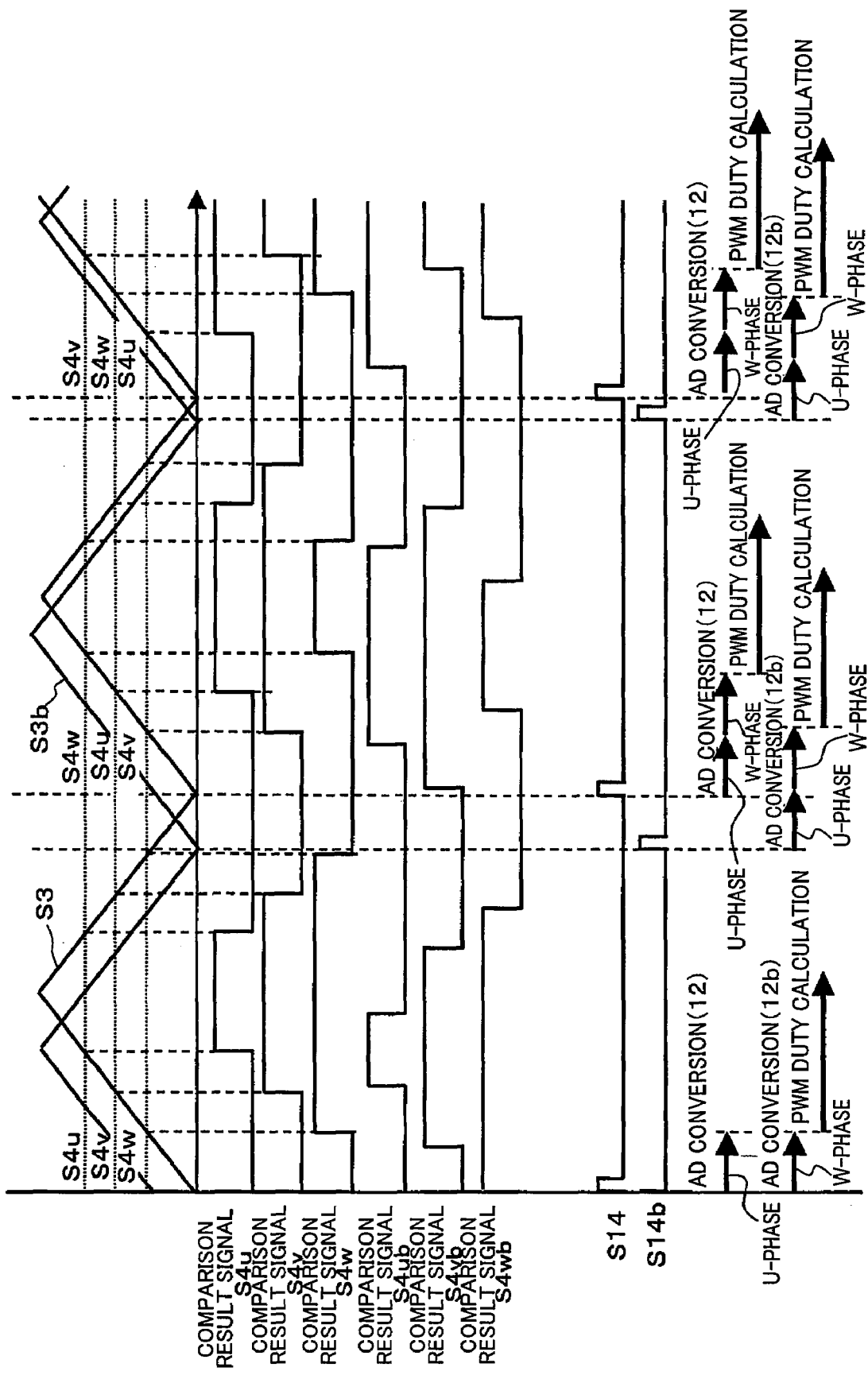
FIG. 8 is a timing chart showing the operation of the microcontroller incorporating the AD conversion control circuit of the fourth embodiment of the present invention.

The operation of the microcontroller incorporating the AD conversion control circuit 20c of the present embodiment configured as above will now be described according to the timing chart of FIG. 8. The simultaneous conversion determining circuit 19 compares the count value S3 of the PWM counter 3 of the PWM circuit 10a and the count value S3b of the PWM counter 3b of the PWM circuit 10b, and outputs a determination signal S19 to the AD conversion timing control circuit 14 indicating the avoidance of simultaneous conversion when the difference is small and the execution of simultaneous conversion when the difference is large. Specifically, the simultaneous conversion determining circuit 19 that has confirmed that the difference between the count value S3 and the count value S3b is small and that the values of both counters are relatively close outputs the determination signal S19 indicating the prohibition of simultaneous conversion control to the AD conversion timing control circuit 14 assuming that when the respective analog signals Sa, Sa are AD conversion processed, the processing timings thereof overlap. The simultaneous conversion determining circuit 19 that has confirmed that the difference between the count value S3 and the count value S3b is large outputs the determination signal S19 indicating the permission of the simultaneous conversion control to the AD conversion timing control circuit 14 assuming that the processing timings thereof do not overlap even if the analog signals Sa, Sa are AD conversion processed.

The AD conversion timing control circuit 14 controls the timing to output the AD conversion start signals S14, S14b to the AD converter 12 and the AD converter 12b based on the determination signal S19.

According to such a configuration, even if a plurality of PWM circuits operate at different carrier periods, the AD conversion necessary for every carrier period can be performed in a minimum time irrespective of the timing of each AD conversion.

Fifth Embodiment

Figure 9:
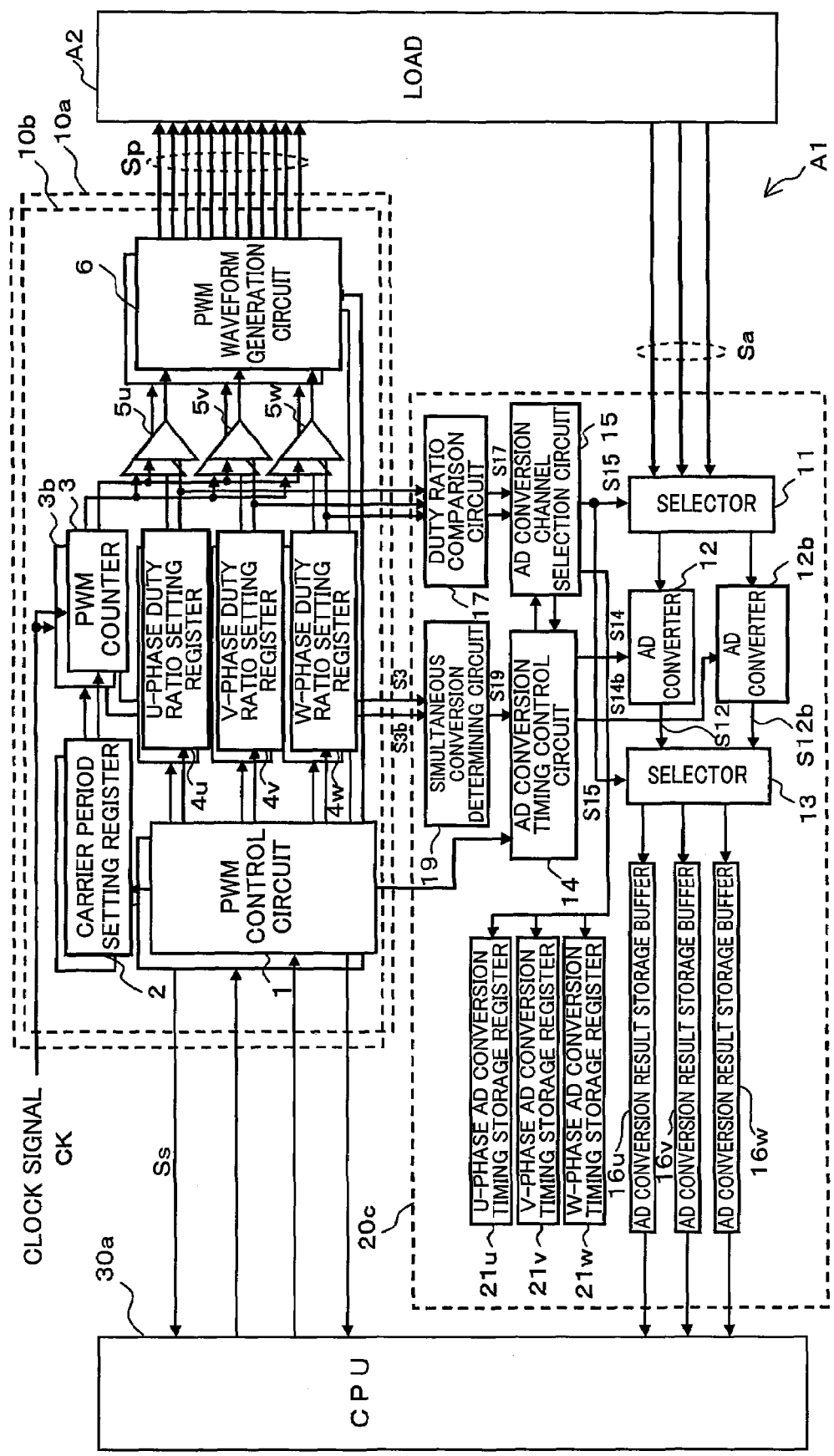
FIG. 9 is a block diagram showing a configuration of a microcontroller incorporating an AD conversion control circuit of a fifth embodiment of the present invention.

FIG. 9 is a block diagram showing a configuration of a microcontroller incorporating an AD conversion control circuit in a fifth embodiment of the present invention. In FIG. 9, the same reference numerals as in FIG. 7 of the fourth embodiment denote the same components and specific description thereof will not be repeated. In addition to the components shown in FIG. 7, a U-phase AD conversion timing storage register 21u for storing information on the timing at which the AD conversion of the U-phase is performed, a V-phase AD conversion timing storage register 21v for storing information on the timing at which the AD conversion of the V-phase is performed, a W-phase AD conversion timing storage register 21w for storing information on the timing at which the AD conversion of the W-phase is performed are arranged. The AD conversion timing storage registers 21u, 21v, 21w of the respective phases each determine the conversion timing of the each phase based on the selection signal S15 output from the AD conversion channel selection circuit 15, and store the information on the timing.

Figure 10:
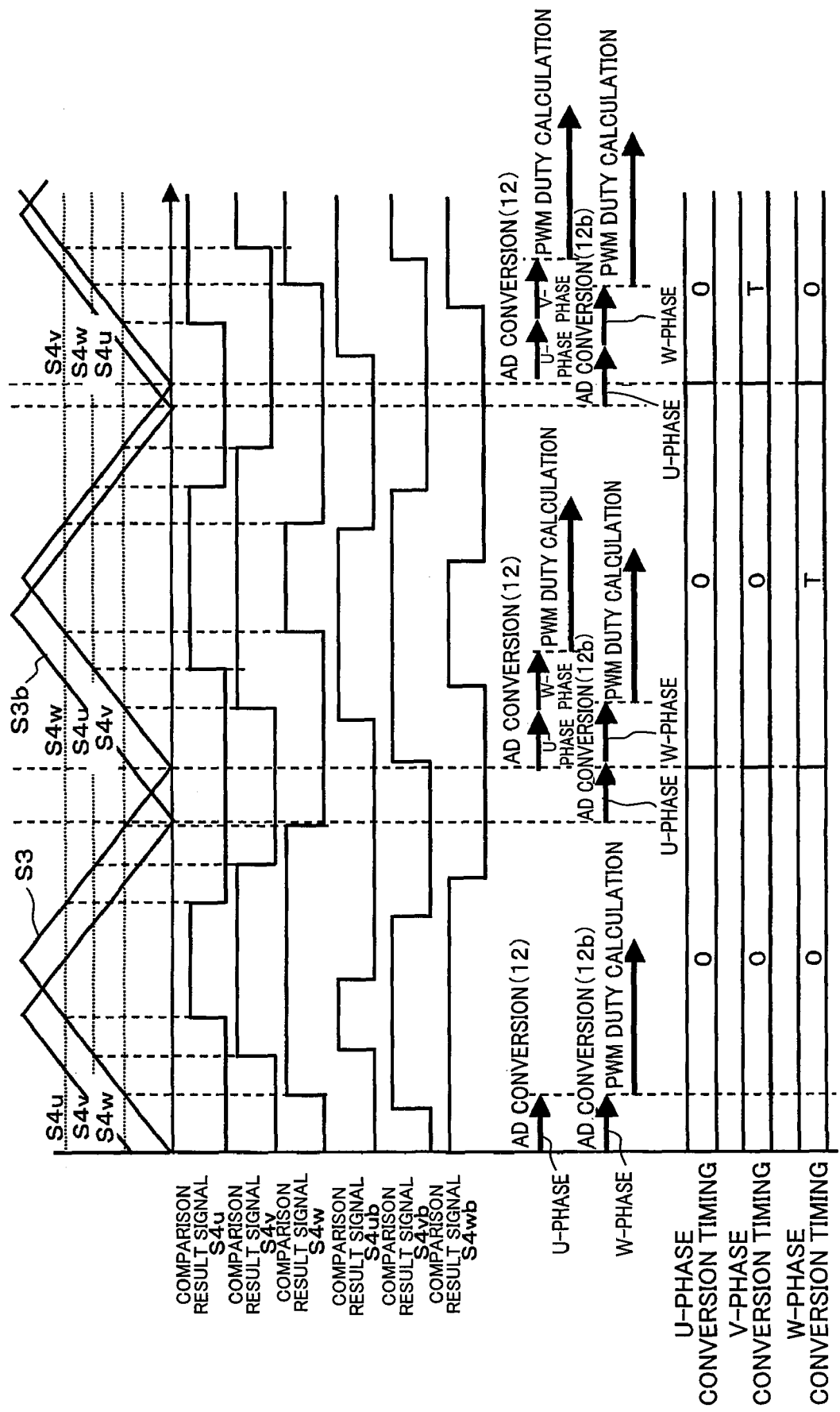
FIG. 10 is a timing chart showing the operation of the microcontroller incorporating the AD conversion control circuit of the fifth embodiment of the present invention.

The operation of the microcontroller incorporating the AD conversion control circuit 20c of the present embodiment configured as above will now be described according to the timing chart of FIG. 10. The U-phase AD conversion timing storage register 21u, the V-phase AD conversion timing storage register 21v, and the W-phase AD conversion timing storage register 21w store the timing at which the AD conversion is performed for every carrier period. When avoiding simultaneous conversion based on the determination signal S19 of the simultaneous conversion determining circuit 19, one AD converter 12 (12b) starts the AD conversion of one phase immediately after the conversion start signal S14 (14b) is provided, and the other AD converter 12b (12) starts the AD conversion of the remaining phase after the AD conversion of the former phase is terminated. When executing simultaneous conversion based on the determination signal S19 of the simultaneous conversion determining circuit 19, the AD converters 12 (12b) simultaneously start the AD conversion of two phases immediately after the conversion start signal S14 (14b) is provided.

Therefore, the timing to perform the AD conversion differs between when performing the simultaneous conversion control and when avoiding the simultaneous conversion control. The conversion timing storage registers 21u, 21v, 21w collect the timing of performing the AD conversion, which differs between when performing the simultaneous conversion control and when avoiding the simultaneous conversion control, for every carrier period, and store information on the timing.

According to such a configuration, when calculating the duty ratio of the PWM signal to be output from the PWM circuit in the next carrier period based on the values stored in the AD conversion result storage buffers 16u, 16v, 16w of the respective phases, the CPU 30 reads out the information stored in the conversion timing storage registers 21U, 21V, 21W of the respective phases and calculates the duty ratio taking the read information into consideration, thereby further enhancing the calculation accuracy. Thus, motor control of higher accuracy can be performed.

Sixth Embodiment

Figure 11:
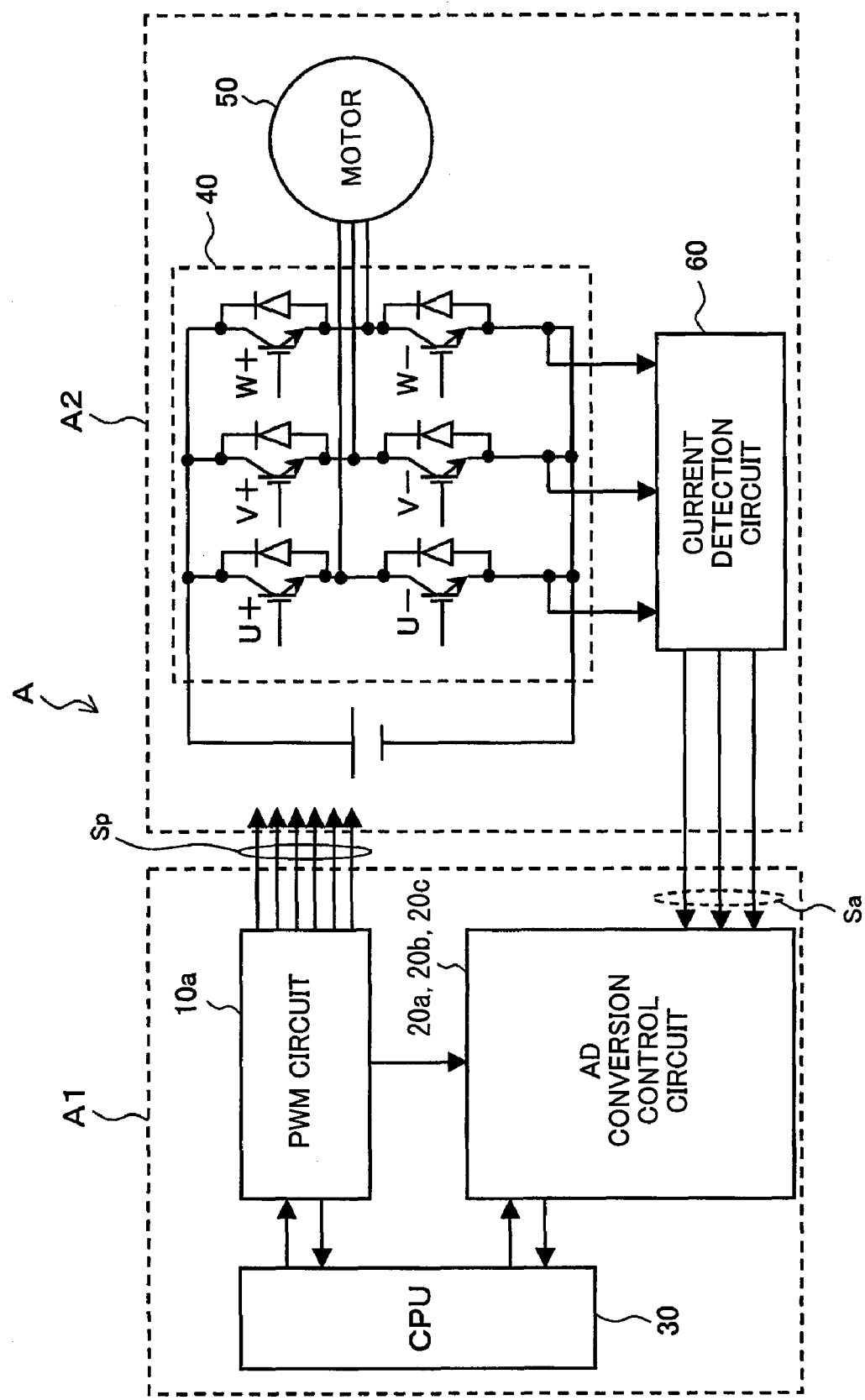
FIG. 11 is a block diagram showing a configuration of a microcontroller incorporating an AD conversion control circuit of a sixth embodiment of the present invention.

FIG. 11 is a block diagram showing a configuration of a brushless motor control circuit A according to a sixth embodiment of the present invention. The microcontroller A1 including any one of the AD conversion control circuits 10 under the first to fifth embodiments, and the motor control unit (load) A2 are arranged. The analog signal Sa of the motor detected by the current detection circuit 60 of the motor control unit A2 is AD converted by the AD converter in the AD conversion control circuit 20a of the microcontroller A1, and the duty ratio of the signal to be output from the microcontroller A1 is calculated based on the result of the AD conversion and then output to the motor control unit A2 as the PWM signal Sp.

Although the invention has been described in detail in its most preferred form, it is understood that the combination and arrangement of parts concerning the preferred form may be changed without deviating from the spirit and scope of the invention as hereinafter claimed.

What is claimed is:

1. An AD conversion control circuit comprising:
a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit;
an AD converter for AD converting the analog signal group and generating a digital signal group that becomes control data for duty ratio setting in the duty ratio setting register, and providing the generated digital signal group to a control unit for controlling the PWM circuit;
a duty ratio comparison circuit for comparing the duty ratios set by the plurality of duty ratio setting registers; and
an AD conversion channel selection circuit for controlling an analog signal group selecting operation by the selector based on a comparison result of the duty ratio comparison circuit,
wherein the AD conversion channel selection circuit controls the selector by selecting two channels to implement AD conversion based on the comparison result of the duty ratio comparison circuit, and selects the largest duty ratio phase and the second largest duty ratio phase for the two channels to be AD converted.

2. The AD conversion control circuit according to claim 1, further comprising an AD conversion timing control circuit for controlling a timing to start AD conversion of the AD converter; wherein
a plurality of the AD converters are arranged;
the selector distributes and provides the analog signal group to the plurality of AD converters; and
the AD conversion timing control circuit performs control so that AD conversion processes of the plurality of AD converters to which the analog signal group has been distributed and provided are simultaneously started.

3. The AD conversion control circuit according to claim 2, wherein a plurality of PWM circuits operating at carrier periods different from each other are arranged as the PWM circuit, the PWM circuits including a PWM counter for counting a clock signal;

the AD conversion control circuit further includes:

a simultaneous conversion determining circuit for determining whether or not to perform simultaneous conversion control on the plurality of PWM circuits based on the value of the PWM counter; and an AD conversion timing control circuit for controlling a start timing to AD convert the analog signal in the AD converter; wherein the AD conversion timing control circuit determines whether or not to perform simultaneous conversion control on the plurality of PWM circuits based on a determination result of the simultaneous conversion determining circuit.

4. The AD conversion control circuit according to claim 3, further comprising a conversion timing storage register for storing information on a timing at which the analog signal group is AD converted by the AD converter for every analog signal.

5. An integrated circuit comprising:
a PWM circuit;
an AD conversion control circuit; and
a control unit, wherein:
the AD conversion control circuit comprises:
a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit;
an AD converter for AD converting the analog signal group and generating a digital signal group that becomes control data for duty ratio setting in the duty ratio setting register, and providing the generated digital signal group to a control unit for controlling the PWM circuit;
a duty ratio comparison circuit for comparing the duty ratios set by the plurality of duty ratio setting registers; and
an AD conversion channel selection circuit for controlling an analog signal group selecting operation by the selector based on a comparison result of the duty ratio comparison circuit, and
the AD conversion channel selection circuit controls the selector by selecting two channels to implement AD conversion based on the comparison result of the duty ratio comparison circuit, and selects the largest duty ratio phase and the second largest duty ratio phase for the two channels to be AD converted.

6. The PWM control device according to claim 5, wherein the PWM circuit includes:
a carrier period setting register for storing a carrier period;
a PWM counter for counting a clock signal; and
a U-phase duty ratio setting register, a V-phase duty ratio setting register, and a W-phase duty ratio setting register for setting a duty ratio of an PWM output for a U-phase, a V-phase, and a W-phase, respectively.

7. A motor control device comprising:
a motor serving as a load; and
the integrated circuit according to claim 5.

8. An AD conversion control circuit comprising:
a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit;

an AD converter for AD converting the analog signal group and generating a digital signal group that becomes control data for duty ratio setting in the duty ratio setting register, and providing the generated digital signal group to a control unit for controlling the PWM circuit;

an AD conversion result storage buffer for storing the digital signal group;

a conversion result comparison circuit for comparing values of the digital signals stored in the AD conversion result storage buffer; and an AD conversion channel selection circuit for controlling an analog signal group selecting operation by the selector based on a comparison result of the conversion result comparison circuit, wherein the AD conversion channel selection circuit controls the selector by selecting two channels to implement AD conversion based on the comparison result of the duty ratio comparison circuit, and selects the largest duty ratio phase and the second largest duty ratio phase for the two channels to be AD converted.

9. The AD conversion control circuit according to claim 8, further comprising an AD conversion timing control circuit for controlling a timing to start AD conversion of the AD converter; wherein
a plurality of the AD converters are arranged;
the selector distributes and provides the analog signal group to the plurality of AD converters; and
the AD conversion timing control circuit performs a control so that AD conversion processes of the plurality of AD converters to which the analog signal group has been distributed and provided are simultaneously started.

10. The AD conversion control circuit according to claim 9, wherein
a plurality of PWM circuits operating at carrier periods different from each other are arranged in place of the PWM circuit, the PWM circuits each including a PWM counter for counting a clock signal;
the AD conversion control circuit further includes:
a simultaneous conversion determining circuit for determining whether or not to perform simultaneous conversion control on the plurality of PWM circuits based on the value of the PWM counter; and
an AD conversion timing control circuit for controlling a start timing to AD convert the analog signal in the AD converter; and
the AD conversion timing control circuit determines whether or not to perform simultaneous conversion control on the plurality of PWM circuits based on a determination result of the simultaneous conversion determining circuit.

11. The AD conversion control circuit according to claim 10, further comprising a conversion timing storage register for storing information on a timing the analog signal group is AD converted by the AD converter for every analog signal.

12. An integrated circuit comprising:
a PWM circuit;
an AD conversion control circuit; and
a control unit, wherein:
the AD conversion control circuit comprises:
a selector for selecting an analog signal group to be used for PWM control out of a plurality of analog signals output by a load PWM controlled based on a PWM control signal of a plurality of phases output by a PWM control circuit according to duty ratios set in a plurality of duty ratio setting registers of the PWM circuit;

an AD converter for AD converting the analog signal group and generating a digital signal group that becomes control data for duty ratio setting in the duty ratio setting register, and providing the generated digital signal group to a control unit for controlling the PWM circuit;

an AD conversion result storage buffer for storing the digital signal group;

a conversion result comparison circuit for comparing values of the digital signals stored in the AD conversion result storage buffer; and an AD conversion channel selection circuit for controlling an analog signal group selecting operation by the selector based on a comparison result of the conversion result comparison circuit, and the AD conversion channel selection circuit controls the selector by selecting two channels to implement AD conversion based on the comparison result of the duty ratio comparison circuit, and selects the largest duty ratio phase and the second largest duty ratio phase for the two channels to be AD converted.

13. The PWM control device according to claim 12, wherein the PWM circuit includes:

a carrier period setting register for storing a carrier period;

a PWM counter for counting a clock signal; and a U-phase duty ratio setting register, a V-phase duty ratio setting register, and a W-phase duty ratio setting register for setting a duty ratio of an PWM output for a U-phase, a V-phase, and a W-phase, respectively.

14. A motor control device comprising:

a motor serving as a load; and the integrated circuit according to claim 12.

* * * * *